United States Patent

Linderman et al.

(10) Patent No.: US 8,809,671 B2
(45) Date of Patent: Aug. 19, 2014

(54) OPTOELECTRONIC DEVICE WITH BYPASS DIODE

(75) Inventors: Ryan Linderman, Oakland, CA (US); Doug Rose, San Jose, CA (US); Nicholas Boitnott, Half Moon Bay, CA (US); Keith Johnston, Palo Alto, CA (US); David B. DeGraaff, Mountain View, CA (US)

(73) Assignee: Sunpower Corporation, San Jose, CA (US)

( * ) Notice: Subject to any disclaimer, the term of this patent is extended or adjusted under 35 U.S.C. 154(b) by 472 days.

(21) Appl. No.: 12/844,594

(22) Filed: Jul. 27, 2010

(65) Prior Publication Data

US 2011/0132431 A1 Jun. 9, 2011

Related U.S. Application Data

(60) Provisional application No. 61/267,637, filed on Dec. 8, 2009.

(51) Int. Cl.
*H01L 31/042* (2014.01)
*H01L 31/052* (2014.01)
*H01L 27/142* (2014.01)

(52) U.S. Cl.
CPC .......... *H01L 31/052* (2013.01); *H01L 27/1421* (2013.01)
USPC ........... 136/246; 136/244; 136/256; 257/433; 257/712

(58) Field of Classification Search
CPC ........................... H01L 31/052; H01L 27/1421
USPC .................... 136/246, 244, 256; 257/433, 712
See application file for complete search history.

(56) References Cited

U.S. PATENT DOCUMENTS

| | | | |
|---|---|---|---|
| 4,153,474 A | 5/1979 | Rex | |
| 4,323,719 A | 4/1982 | Green | |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,567,316 A * | 1/1986 | Hollaus et al. ................ | 136/246 |

(Continued)

FOREIGN PATENT DOCUMENTS

| | | |
|---|---|---|
| DE | 10041271 | 3/2002 |
| DE | 202004005198 | 8/2004 |

(Continued)

OTHER PUBLICATIONS

JP 05152596, Machine Translation, Takeoka, Jun. 1993.*

(Continued)

*Primary Examiner* — Devina Pillay
(74) *Attorney, Agent, or Firm* — Knobbe, Martens, Olson & Bear LLP

(57) ABSTRACT

Optoelectronic devices with bypass diodes are described. An optoelectronic device includes a bypass diode, a heat spreader unit disposed above, and extending over, the bypass diode, and a heat sink disposed above the heat spreader unit. Another optoelectronic device includes a bypass diode, a heat spreader unit disposed above, but not extending over, the bypass diode, and a heat sink disposed above the heat spreader unit.

21 Claims, 9 Drawing Sheets

(56) References Cited

U.S. PATENT DOCUMENTS

| | | |
|---|---|---|
| 4,640,734 A | 2/1987 | Roberts et al. |
| 4,643,543 A | 2/1987 | Mohn et al. |
| 4,643,544 A | 2/1987 | Loughran |
| 4,759,803 A | 7/1988 | Cohen |
| 5,180,441 A | 1/1993 | Cornwall et al. |
| 5,248,346 A | 9/1993 | Fraas et al. |
| 5,334,496 A | 8/1994 | Pond et al. |
| 5,344,496 A | 9/1994 | Stern et al. |
| 5,389,158 A | 2/1995 | Fraas et al. |
| 5,409,549 A | 4/1995 | Mori |
| 5,498,297 A | 3/1996 | O'Neill et al. |
| 5,580,395 A | 12/1996 | Yoshioka et al. |
| 5,616,185 A | 4/1997 | Kukulka |
| 5,660,644 A | 8/1997 | Clemens |
| 5,697,192 A | 12/1997 | Inoue |
| 5,865,905 A | 2/1999 | Clemens |
| 5,899,199 A | 5/1999 | Mills |
| 5,990,415 A | 11/1999 | Green et al. |
| 6,034,322 A | 3/2000 | Pollard |
| 6,131,565 A | 10/2000 | Mills |
| 6,323,478 B1 | 11/2001 | Fujisaki et al. |
| 6,359,209 B1 | 3/2002 | Glenn et al. |
| 6,442,937 B1 | 9/2002 | Stone et al. |
| 6,553,729 B1 | 4/2003 | Nath et al. |
| 6,635,507 B1 | 10/2003 | Boutros et al. |
| 7,468,485 B1 | 12/2008 | Swanson |
| 7,554,031 B2 | 6/2009 | Swanson et al. |
| 7,709,730 B2 | 5/2010 | Johnson et al. |
| 7,820,906 B2 | 10/2010 | Johnson et al. |
| 7,825,327 B2 | 11/2010 | Johnson et al. |
| 7,932,461 B2 | 4/2011 | Johnson et al. |
| 7,952,057 B2 | 5/2011 | Finot et al. |
| 7,968,791 B2 | 6/2011 | Do et al. |
| 7,985,919 B1 * | 7/2011 | Roscheisen et al. ........... 136/246 |
| 8,049,150 B2 | 11/2011 | Johnson et al. |
| 2004/0074490 A1 | 4/2004 | Mills et al. |
| 2005/0141195 A1 * | 6/2005 | Pokharna et al. .............. 361/699 |
| 2006/0137733 A1 * | 6/2006 | Schripsema et al. ........... 136/246 |
| 2007/0151598 A1 | 7/2007 | De Ceuster et al. |
| 2007/0257274 A1 | 11/2007 | Martter et al. |
| 2008/0035198 A1 | 2/2008 | Teppe et al. |
| 2009/0056699 A1 | 3/2009 | Mills et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0095284 A1 | 4/2009 | Klotz |
| 2009/0139557 A1 | 6/2009 | Rose et al. |
| 2010/0089435 A1 * | 4/2010 | Lockenhoff .................. 136/246 |
| 2010/0154788 A1 | 6/2010 | Wells et al. |
| 2010/0163014 A1 | 7/2010 | Johnson et al. |
| 2010/0175740 A1 | 7/2010 | Johnson et al. |
| 2010/0193014 A1 | 8/2010 | Johnson et al. |
| 2010/0236626 A1 | 9/2010 | Finot et al. |
| 2010/0294336 A1 | 11/2010 | Johnson et al. |
| 2010/0319682 A1 | 12/2010 | Klotz |
| 2011/0023940 A1 | 2/2011 | Do et al. |
| 2011/0030764 A1 | 2/2011 | Seo et al. |
| 2011/0132457 A1 | 6/2011 | Finot |
| 2011/0186130 A1 | 8/2011 | Finot et al. |
| 2011/0226309 A1 | 9/2011 | Do et al. |
| 2011/0226310 A1 | 9/2011 | Johnson et al. |

FOREIGN PATENT DOCUMENTS

| | | | |
|---|---|---|---|
| GB | 2340993 | 3/2000 | |
| JP | 05-152596 | * 6/1993 | ............ H01L 31/042 |
| JP | 2001-298134 A | 10/2001 | |
| JP | 2006-019532 A | 1/2006 | |
| JP | 2007184542 | 7/2007 | |
| JP | 2007194521 | 8/2007 | |
| JP | 2007214247 | 8/2007 | |
| KR | 1020070070183 | 7/2007 | |
| KR | 1020090014153 | 2/2009 | |
| WO | WO9957493 | 11/1999 | |
| WO | WO2007096157 | 8/2007 | |
| WO | WO2007096158 | 8/2007 | |
| WO | WO2008022409 | 2/2008 | |
| WO | WO 2008/107205 A2 * | 9/2008 | ............. H01L 31/02 |
| WO | WO2008153922 | 12/2008 | |
| WO | WO2009023063 | 2/2009 | |
| WO | WO2009029275 | 3/2009 | |
| WO | WO2009029277 | 3/2009 | |
| WO | WO 2009/110757 A2 | 9/2009 | |

OTHER PUBLICATIONS

Stern, T. G., "Interim results of the SLATS concentrator experiment on LIPS-II (space vehicle power plants)," Photovoltaic Specialists Conference, 1988., Conference Record of the Twentieth IEEE , vol., No., pp. 837-840 vol. 2, 1988. URL: http://ieeexplore.ieee.org/stamp/stamp.jsp?tp=&arnumber=105822&isnumber=3239.

Carroll, Don et al. "Production of The Alpha Solarco Proof-of-Concept Array," IEEE, 1990, pp. 1136-1141.

Shepard, Jr., N. F. et al., "The Integration of Bypass Diodes with Terrestrial Photovoltaic Modules and Arrays," IEEE, 1984, pp. 676-681.

Edenburn, Michael W., et al. "Shading Analysis of a Photovoltaic Cell String Illuminated by a Parabolic Trough Concentrator," IEEE, 1981, pp. 63-68.

Bardwell, Karen et al., "Minimizing End Shadowing Effects on Parabolic Concentrator Arrays," IEEE, 1980, pp. 765-770.

Quagan, Robert J., "Laser Diode Heat Spreaders", Ion Beam Milling, Inc., website copyright 2010, http://www.ionbeammilling.com/default.asp, 9 pages.

Vivar Garcia, Marta, "Optimisation of the Euclides Photovoltaic Concentrator", 2009, 419 pages.

International Search Report and Written Opinion dated Jul. 21, 2011, International Appl. No. PCT/US2010/056386 (filed Nov. 11, 2010), 10 pages.

* cited by examiner

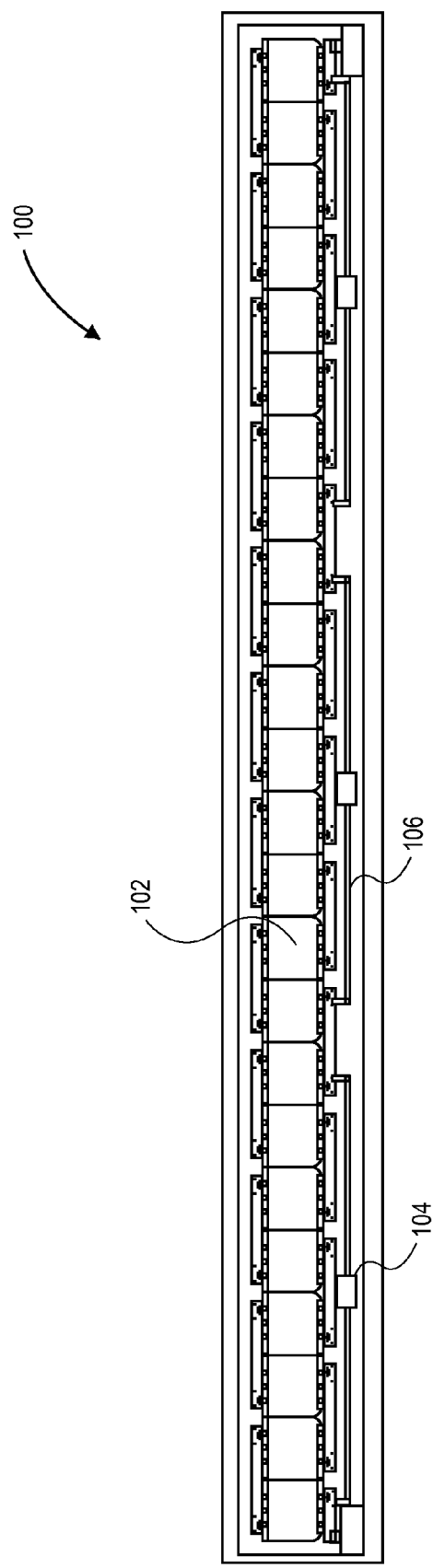

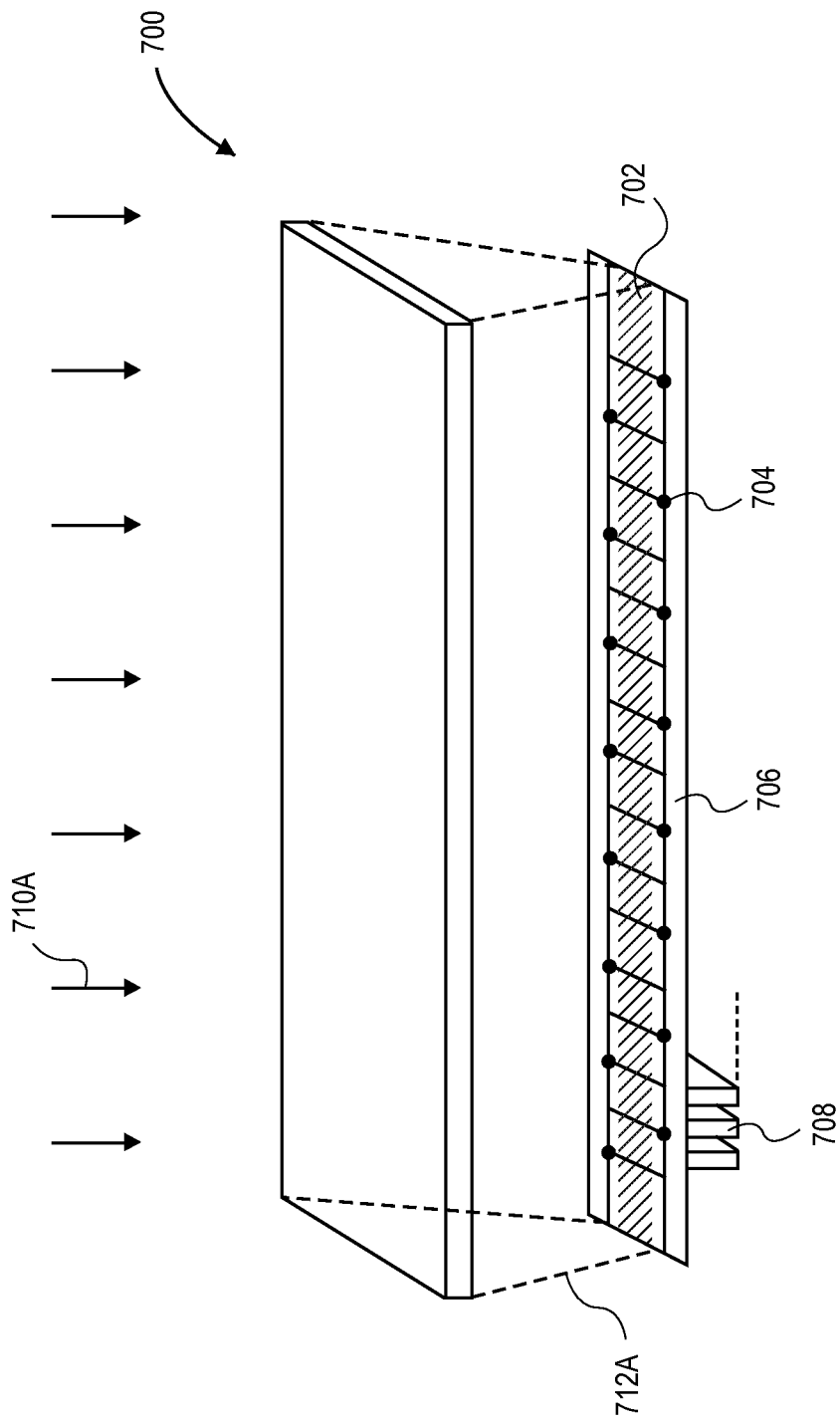

US 8,809,671 B2

OPTOELECTRONIC DEVICE WITH BYPASS DIODE

CROSS REFERENCE TO RELATED APPLICATIONS

This application claims the benefit of U.S. Provisional Application No. 61/267,637, filed Dec. 8, 2009, the entire contents of which are hereby incorporated by reference herein.

TECHNICAL FIELD

Embodiments of the present invention are in the field of renewable energy and, in particular, optoelectronic devices and systems with bypass diodes.

BACKGROUND

Light-emitting diode (LED) and photovoltaic (PV) devices are two common types of optoelectronic devices. Thermal management and assembly of optoelectronic systems, such as systems including LED and PV devices, may be considered when evaluating such systems for fabrication and deployment. For example, the area of systems of devices with integrated bypass diodes is one area ripe for improvements in thermal management and assembly. Challenges for the fabrication and deployment of such systems include a possible need for a low resistance thermal path between the bypass diode and a heat sink, as well as a robust electrical isolation of operating voltages.

BRIEF DESCRIPTION OF THE DRAWINGS

FIG. 1 illustrates a plan view of a conventional optoelectronic system including a bypass circuit path and externally mounted diode.

FIG. 7A illustrates a solar concentrator apparatus with a summer solstice illumination pattern, in accordance with an embodiment of the present invention.

DETAILED DESCRIPTION

Figure 2A:
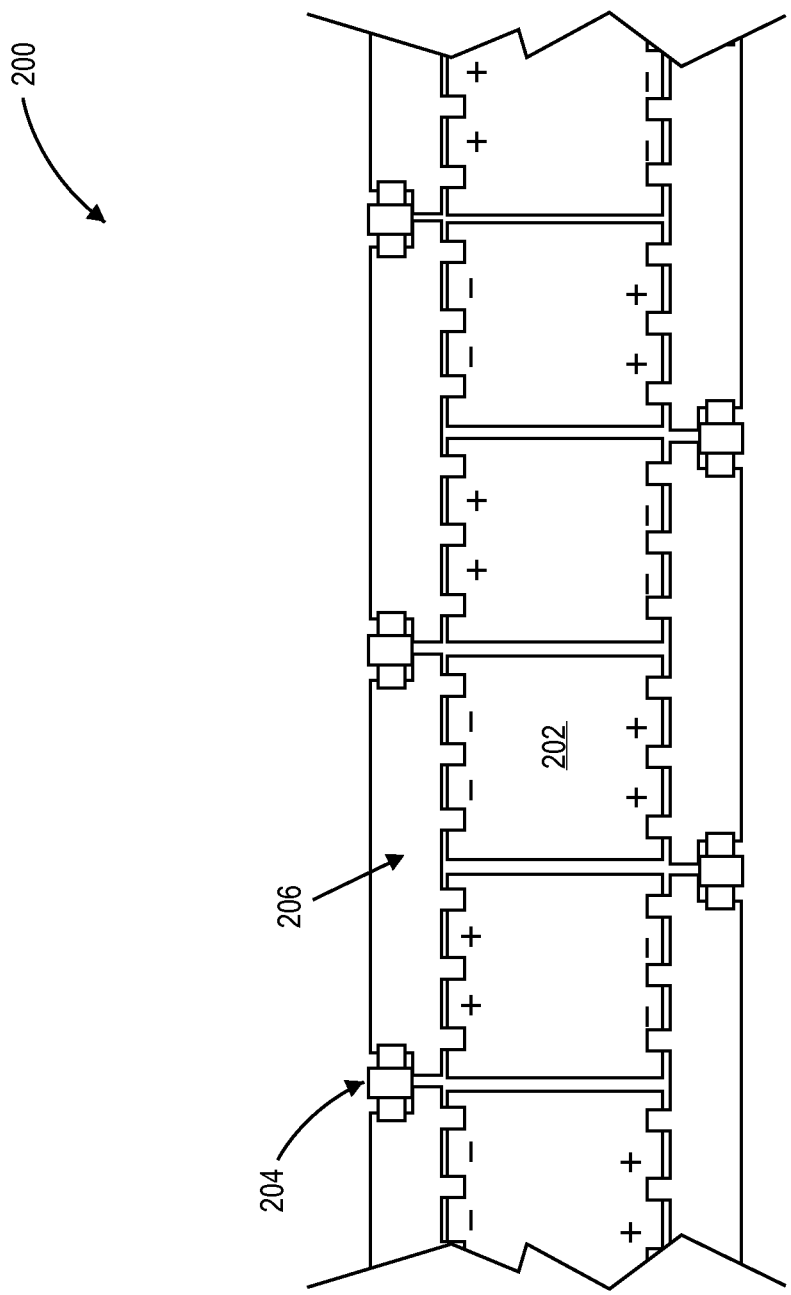
FIG. 2A illustrates a plan view of a portion of an optoelectronic system with internal bypass diodes, in accordance with an embodiment of the present invention.

Optoelectronic devices with bypass diodes and optoelectronic systems with bypass diodes are described herein. In the following description, numerous specific details are set forth, such as specific arrangements of heat spreader units relative to bypass diodes, in order to provide a thorough understanding of embodiments of the present invention. It will be apparent to one skilled in the art that embodiments of the present invention may be practiced without these specific details. In other instances, well-known fabrication techniques, such as lamination techniques, are not described in detail in order to not unnecessarily obscure embodiments of the present invention. Furthermore, it is to be understood that the various embodiments shown in the Figures are illustrative representations and are not necessarily drawn to scale.

Disclosed herein are optoelectronic devices with bypass diodes. In one embodiment, an optoelectronic device includes a bypass diode. A heat spreader unit is disposed above, and extending over, the bypass diode. A heat sink is disposed above the heat spreader unit. In one embodiment, an optoelectronic device includes a bypass diode. A heat spreader unit is disposed above, but not extending over, the bypass diode. A heat sink is disposed above the heat spreader unit. In one embodiment, the optoelectronic device is a photovoltaic cell.

Also disclosed herein are optoelectronic systems with bypass diodes. In one embodiment, an optoelectronic system includes a plurality of pairs of optoelectronic devices. The optoelectronic system also includes a plurality of bypass diodes, one or more of the bypass diodes disposed between each of the pairs of optoelectronic devices. Also included is a plurality of heat spreader units, one or more of the heat spreader units disposed above, and extending over, each of the bypass diodes. The optoelectronic system also includes a plurality of heat sinks, one or more of the heat sinks disposed above each of the heat spreader units. In one embodiment, an optoelectronic system includes a plurality of pairs of optoelectronic devices. The optoelectronic system also includes a plurality of bypass diodes, one or more of the bypass diodes disposed between each of the pairs of optoelectronic devices. Also included is a plurality of heat spreader units, one or more of the heat spreader units disposed above, but not extending over, each of the bypass diodes. The optoelectronic system also includes a plurality of heat sinks, one or more of the heat sinks disposed above each of the heat spreader units. In one embodiment, the plurality of optoelectronic devices is a plurality of photovoltaic cells.

Thermal management and assembly of optoelectronic systems, such as light-emitting diode (LED) or photovoltaic (PV) systems, may be addressed by integrating bypass diodes within a cell package or laminate system. However, in accordance with an embodiment of the present invention, due to a high density of dissipated power within such a diode, a low thermal resistance path to ambient air may be needed in order to ensure reliable operation of a corresponding diode and cell enclosure. Furthermore, in order to facilitate high volume manufacturing, design concepts and assembly techniques that are based on continuous processing may also be desirable. In an embodiment, a thermal resistance between a bypass diode and an external heat sink is reduced, while a more uniform and flat surface across a high heat flux region of a cell enclosure or package is provided. In one embodiment, a flat surface along a back side of a cell enclosure improves interface and bond quality during attachment of the cell and a bypass diode enclosure to a heat sink. In an embodiment, the improved thermal performance allows devices to operate at lower temperatures thereby increasing light to electrical conversion efficiency and reducing degradation and failure of components. In addition, in one embodiment, a high volume continuous manufacturing processes to be used to fabricate arrays of optoelectronic die for LED lighting applications and photovoltaic receivers for solar concentrators is enabled.

Conventional methods of integrating bypass diodes into systems such as PV and LED systems have involved attaching the bypass diodes externally to a cell laminate or package with back-sheet penetrations to allow electrical connections. This approach may require a significant number of additional assembly steps and may limit the number of diodes that can be integrated along a string of cells. In accordance with an embodiment of the present invention, a flexible substrate is manufactured by continuous roll processing of metal foils, dielectric layers and polymer adhesive coatings. In one embodiment, bare optoelectronic die and bypass diodes are then soldered to the leads of the substrate or cell interconnects and then encapsulated between a glass cover sheet and a metal heat spreader integrated within the substrate at the region of highest heat flux into the die. In a specific embodiment, shallow pockets or through-holes are punched into the substrates to accommodate a diode that is thicker than the cells, allowing for a thin, low resistance thermal coupling to the heat spreader or substrate. The through-holes or shallow pockets may allow fabrication of a flatter back surface of the cell package or enclosure that improves thermal coupling of the heat sink and cell. A heat spreader with area removed directly over a high heat density may seem counter-intuitive. However, in a particular embodiment, since the majority of the diode heat flows to the heat sink via the interconnects and cell, any improvements in system thermal management will also improve (e.g., reduce) the diode temperatures. This may also result in a single thermal solution for the both the cell and diode. In an aspect of the above particular embodiment, extending the heat spreader beyond the cell and heat sink footprint also allows thermal integration of diodes mounted in a peripheral location to the cell.

As such, in an embodiment, a portion of an optoelectronic system is manufactured in roll form to allow for high volume continuous processing and subsequent assembly of such an optoelectronic system. In an embodiment, this approach enables a shift in the way photovoltaic systems are manufactured and assembled while providing improved thermal and electrical functionality.

As photovoltaic systems leverage concentrated optical technologies to reduce cell size, the benefits of a robust bypass circuit design may also increase. Since concentrator systems often have smaller cell areas, a thermal load from back-driving a string current through such a cell may increase the chance for damage and permanent failure of the cell as a result of overheating. Perhaps most significant, in an embodiment, system performance may be significantly reduced by partial shading, mismatch and other defects in a string and, thus, a more frequent integration of bypass diodes (e.g., 1 bypass diode per cell, 1 bypass diode per 2 cells, etc.) may limit the impact of the non-uniformity while capturing the maximum possible performance of the remaining high performing cells. Further, in an embodiment, a higher frequency of diodes limits the reverse voltage across the diode terminals, reducing the electronic requirements of the device and the likelihood of a reverse breakdown failure.

From an assembly and manufacturing perspective, the integration of a bypass diode into a cell string without back-sheet penetrations may reduce complexity and secondary manufacturing steps, providing additional benefits beyond system performance. For example, in conventional 1-sun photovoltaic modules, the two-dimensional array of cells are often divided into series cell strings (typically 3) with a bypass diode allowing electrical current to bypass, by a parallel path, one or more strings if those cells are shaded or inoperative. In such a configuration, the diodes may be centrally located within the junction box which also houses the cable connections to the module via penetrations from the back-sheet of the laminated cell array. However, due to the central location of the junction box, additional electrical leads may need to be run between the cells at the end of the strings and the junction box, adding additional cost, assembly steps and potential failure points. In accordance with an embodiment of the present invention, while a central junction box is appropriate for a two-dimensional array of cells, it is not ideal for a concentrator photovoltaic module with a linear cell array that would favor connections at opposite ends of the cell string. For example, creating electrical runs down the entire length of the concentrator receiver may add significant cost and manufacturing complexity.

One additional hurdle that may need to be overcome when integrating diode systems within a cell laminate or package is the thermal management requirements of the diodes when they dissipate power in bypass operation. For example, in an embodiment, while the power dissipated in the diode is small relative to the system power (since it is dissipated within the small diode package [e.g., <1 cm$^2$]), the thermal load density reaches values that may require thermal coupling to a heat sink (ideally the same heat sink used for the cells).

As such, in accordance with an embodiment of the present invention, a bypass diode or multiple bypass diodes are included internally within a laminated cell package and are thermally coupled to a cell mounted heat sink via cell interconnects and, in some embodiments, an additional integrated heat spreader. In one embodiment, rather than running additional electrical leads to bypass a set number of cells, each with back-sheet penetrations and an externally mounted diode, bypass diodes are integrated between the cell and interconnects on a diode-per-cell or diode-per-two-cell basis, as described by comparing the structures of FIG. 1 and FIGS. 2A and 2B. In an embodiment, an approach such as the approach described in association with FIG. 2B allows for a narrower receiver package with lower material costs and a reduced form factor than the approach of FIG. 1 or FIG. 2A.

A conventional approach to bypass diodes may be to include such diodes at a pitch of every 8 cells while utilizing a bypass circuit path and externally mounted diode with laminate back-sheet penetrations. For example, FIG. 1 illustrates a plan view of a conventional optoelectronic system including a bypass circuit path and externally mounted diode. Referring to FIG. 1, a conventional photovoltaic system 100 includes a plurality of cells 102. At some fixed period, an external diode 104 is included for every several cells. Bypass circuit paths 106 are also included.

By contrast, in accordance with an embodiment of the present invention, internal bypass diodes may be included at a pitch of one-per-two-cells mounted directly to the cell interconnects. In one embodiment, a cell string is then laminated between a back-sheet and a glass superstrate to encapsulate diodes with the cell string. For example, FIG. 2A illustrates a plan view of a portion of an optoelectronic system with internal bypass diodes, in accordance with an embodiment of the present invention. Referring to FIG. 2A, a photovoltaic system 200 includes a plurality of cells 202. Bypass diodes 204 located between cell interconnects 206 on the upper side of the cell are included, e.g., for every pair of cells, as depicted in FIG. 2A. As depicted, bypass diodes located between interconnects on the lower side of the cell may be included as redundant diodes that allow increased reliability if there are any failures in bypass diodes 204. Furthermore, these additional bypass diodes may reduce cost and offer the highest performance for known illumination irregularities that may occur. Cell interconnects 206 run between the bypass diodes 204 and parallel to the pairs of cells 202. In an additional embodiment, not depicted, additional diodes are placed onto the lower interconnects allowing the ability to bypass current on a paired cell basis, or even possibly on a single cell basis. In an embodiment, the frequency of diodes relative to cell pairs can be increased or decreased at different locations within the receiver, e.g., at the ends or central region of a receiver.

Figure 2B:
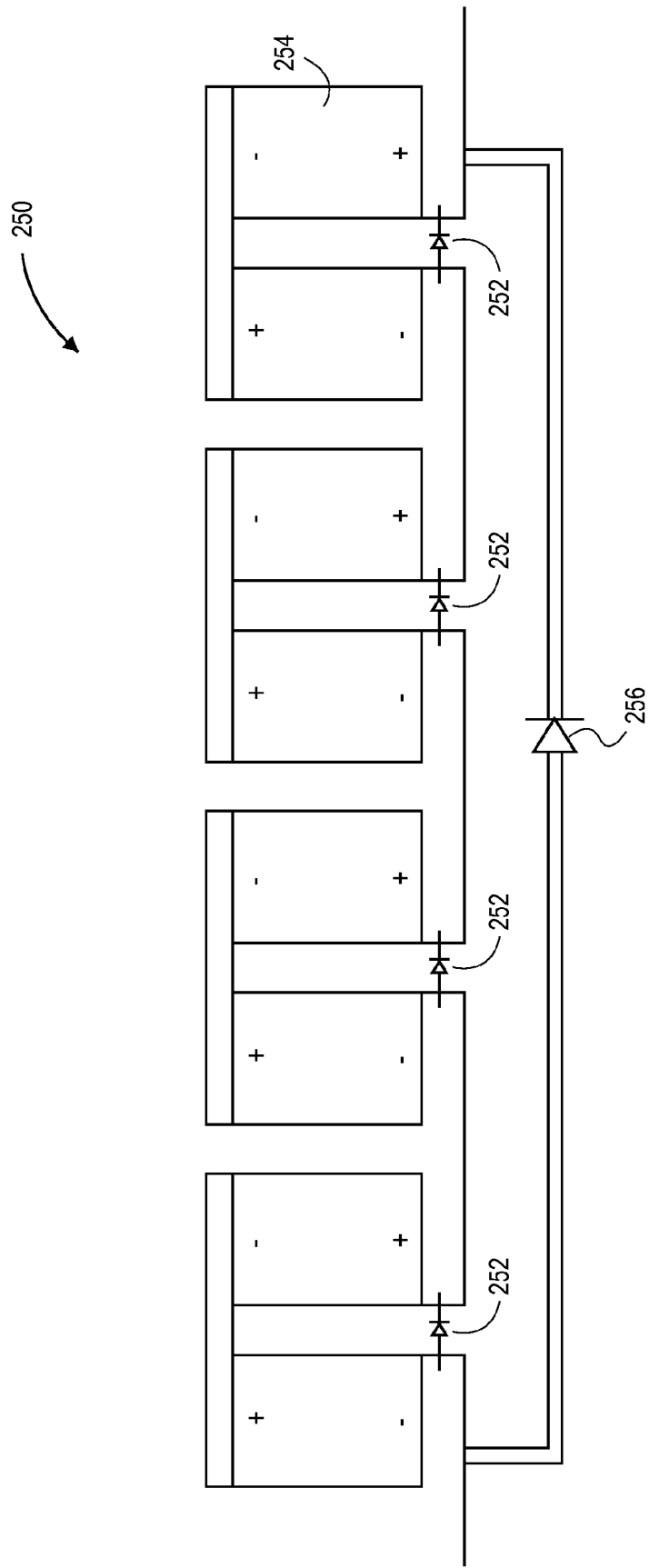
FIG. 2B illustrates a plan view of a portion of an optoelectronic system with internal bypass diodes, in accordance with an embodiment of the present invention.

In accordance with an alternative embodiment, FIG. 2B illustrates a plan view of a portion of an optoelectronic system with internal bypass diodes, in accordance with an embodiment of the present invention. Referring to FIG. 2B, a photovoltaic system 250 includes bypass diodes 252 on only one side of the array of cells 254. In one embodiment, an optional bypass diode 256 is included in photovoltaic system 250 and is also connected in parallel to the bypass diodes 252, which are connected in series, as depicted in FIG. 2B. In a specific embodiment, a voltage drop is mitigated or avoided that may otherwise occur when several bypass diodes are connected in series.

In accordance with an embodiment of the present invention, by soldering a bypass diode between cell interconnects, the bypass diode is available for attachment at the same time as the cell string soldering operation, or may be pre-applied to the interconnects before the cells are attached. In one embodiment, this approach eliminates the needs for back-sheet penetrations and the subsequent assembly steps normally used to attach potted enclosures to the backside of a laminate to protect external features of the cell string.

In accordance with an embodiment of the present invention, thermal management of bypass diodes is accomplished by creating a suitable thermal path from the diode to the receiver heat sink via the cell interconnects. In one embodiment, this approach requires a modified heat sink that extends beyond the cell to cover the interconnect area, an interconnect design that maximizes area under the heat sink and an increased interconnect thickness to allow better heat spreading down the interconnect as, described in association with FIG. 3, below.

Figure 3:
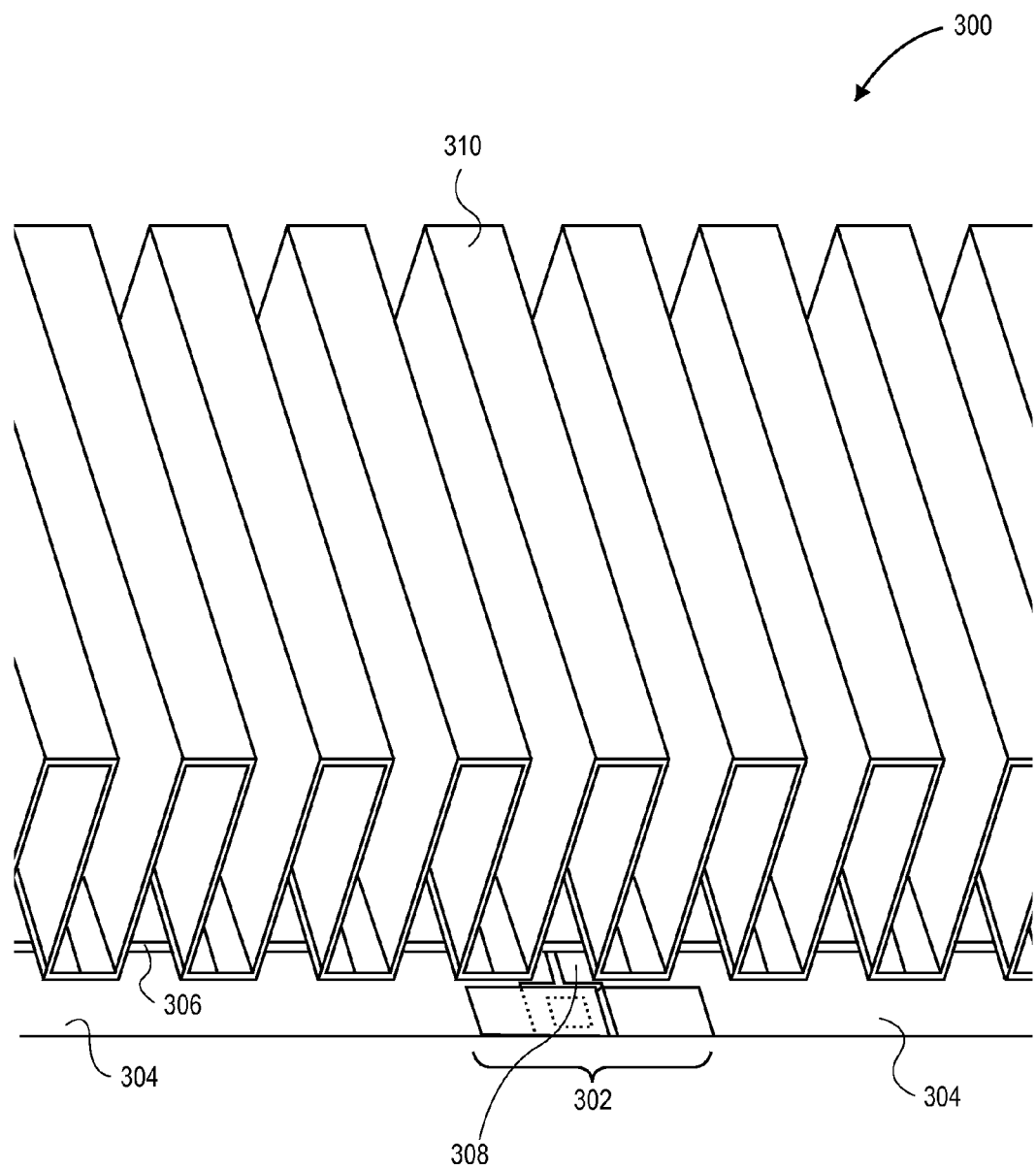
FIG. 3 illustrates an isometric view of a portion of an optoelectronic system with internal bypass diodes, in accordance with an embodiment of the present invention.

Thermal coupling between a bypass diode and heat sink may be provided via a cell interconnect or a pair of cell interconnects. For example, FIG. 3 illustrates an isometric view of a portion of an optoelectronic system with internal bypass diodes, in accordance with an embodiment of the present invention. Referring to FIG. 3, a photovoltaic system 300 includes a bypass diode 302 between cell interconnects 304 and integrated with cells 306. In one embodiment, cell interconnects 304 include interconnect extensions 308. In accordance with an embodiment of the present invention, a heat sink 310 is included above the cells 306.

In an embodiment, enhanced thermal management can also be accomplished by integrating a heat spreader within a laminate or thermal package. In one embodiment, a heat spreader extends over a cell and interconnects and provides a parallel thermal path from a diode to the heat sink in addition to the cell interconnect. In a specific embodiment, this approach reduces diode to ambient thermal resistance and reduces the thermal requirements for the cell interconnect. In an embodiment, a heat spreader can be designed with a recessed region to accommodate the diode vertical height or a through-via that traces the outer perimeter of the diode giving more vertical flexibility in diode form factor as, described below in association with FIGS. 4 and 5.

In an aspect of the present invention, an interconnect-integrated diode may be included under a heat spreader with a recessed cavity to accommodate the diode. For example, FIG. 4 illustrates a cross-sectional view of an optoelectronic device with a bypass diode, in accordance with an embodiment of the present invention.

Figure 4:
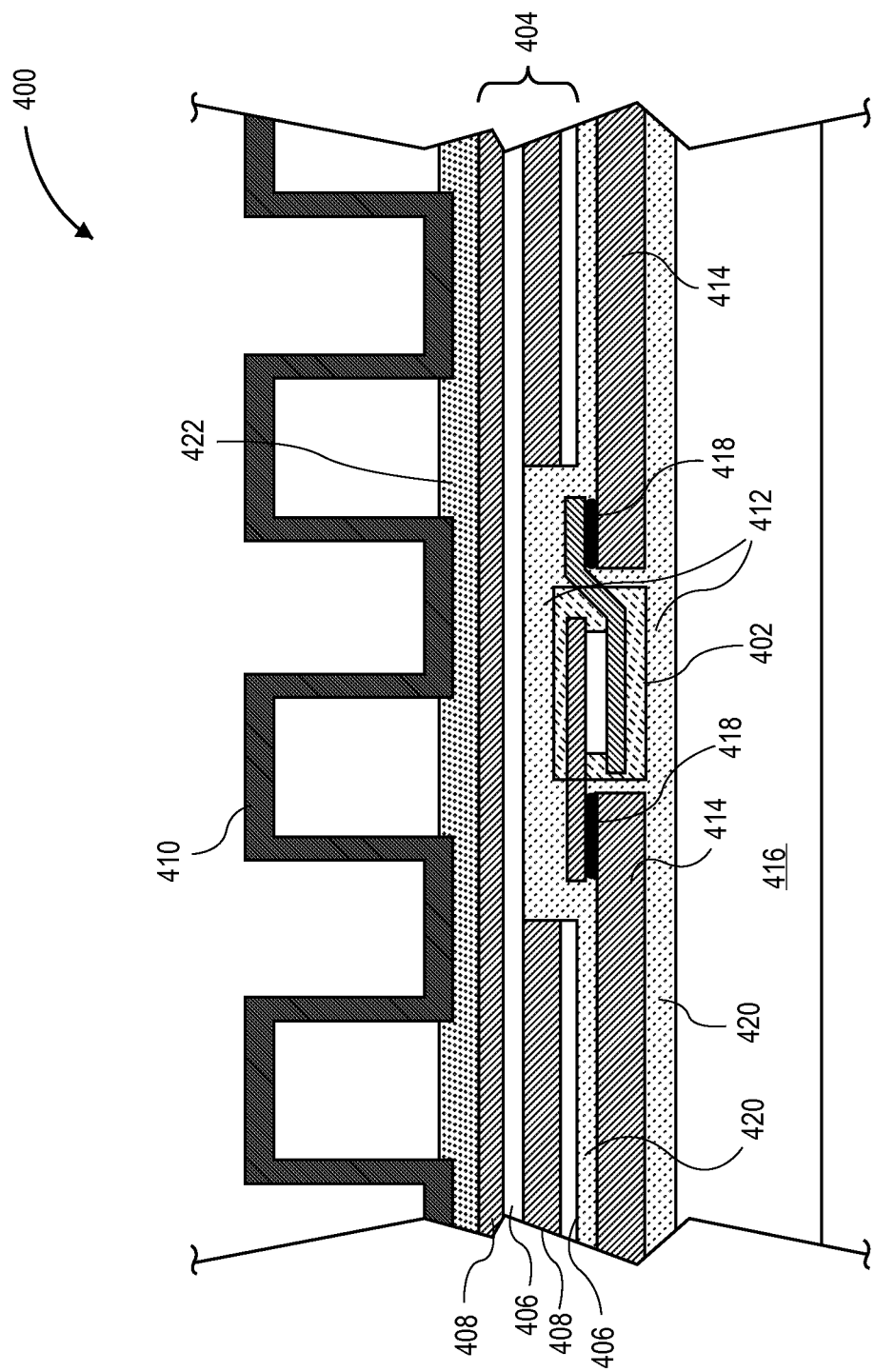
FIG. 4 illustrates a cross-sectional view of an optoelectronic device with a bypass diode, in accordance with an embodiment of the present invention.

Referring to FIG. 4, an optoelectronic device 400 includes a bypass diode 402. Optoelectronic device 400 also includes a heat spreader unit 404 disposed above, and extending over, bypass diode 402. In accordance with an embodiment of the present invention, heat spreader unit 404 includes one or more dielectric layers 406 and one or more thermally conductive layers 408, as depicted in FIG. 4. Optoelectronic device 400 also includes a heat sink 410 disposed above heat spreader unit 404.

Referring again to FIG. 4, in an embodiment, bypass diode 402 is disposed in a recessed cavity 412 under heat spreader unit 404. In an embodiment, bypass diode 402 is coupled with a pair of interconnects 414, heat spreader unit 404 disposed above the pair of interconnects 414, as depicted in FIG. 4. In one embodiment, bypass diode 402 and the pair of interconnects 414 are disposed above a transparent superstrate 416, bypass diode 402 is coupled with the pair of interconnects 414 by one or more bond pads 418, and bypass diode 402 is separated from transparent superstrate 416 and heat spreader unit 404 by one or more encapsulant layers 420. In an embodiment, heat sink 410 includes a folded fin separated from heat spreader unit 404 by one or more thermal adhesive layers 422, as depicted in FIG. 4. In an alternative embodiment, not shown, heat sink 410 includes a plurality of stand-alone fins coupled by a common base, the common base separated from heat spreader unit 404 by one or more thermal adhesive layers. In an embodiment, the S-shaped bend in the bottom lead of diode 402 aids in reduction of coefficient of thermal expansion related stresses that may develop during normal operating temperature ranges. In an additional embodiment, the interconnects 414 are bent with a similar S-shape and a bare diode die is mounted directly between the interconnects, removing the need for additional bond pads between the bare diode die and the diode leads.

In another embodiment, diode 402 is encapsulated prior to assembly to form optoelectronic device 400. In one embodiment, this approach allows for isolation of an elevated temperature of the diode die, which can tolerate significantly higher temperatures as compared with optoelectronic system encapsulant 420. In one embodiment, the material surrounding such an initially encapsulated diode 402 is itself encapsulated by a material different from optoelectronic system encapsulant 420, as depicted by the different shading within the box surrounding diode 402 in FIG. 4.

In association with the discussion of FIGS. 2-4 above, a plurality of optoelectronic devices, such as the optoelectronic device of FIG. 4, may be included in an optoelectronic system. Thus, in accordance with an embodiment of the present invention, an optoelectronic system includes a plurality of pairs of optoelectronic devices. In one embodiment, each optoelectronic device is a back-contact solar cell. The optoelectronic system also includes a plurality of bypass diodes, one or more of the bypass diodes disposed between each of the pairs of optoelectronic devices. The optoelectronic system also includes a plurality of heat spreader units, one or more of the heat spreader units disposed above, and extending over, each of the bypass diodes. The optoelectronic system also includes a plurality of heat sinks, one or more of the heat sinks disposed above each of the heat spreader units.

In an embodiment, each bypass diode of the above optoelectronic system is disposed in a recessed cavity under one of the heat spreader units. In an embodiment, each bypass diode is coupled with a pair of interconnects, one of the heat spreader units disposed above the pair of interconnects. In one embodiment, each bypass diode and the respective pair of interconnects are disposed above a transparent superstrate, each bypass diode is coupled with the respective pair of interconnects by one or more bond pads, and each bypass diode is separated from the substrate and the heat spreader unit by one or more encapsulant layers. In an embodiment, each heat sink includes a folded fin separated from the respective heat spreader unit by one or more thermal adhesive layers. In an alternative embodiment, each heat sink includes a plurality of stand-alone fins coupled by a common base, each common base separated from the respective heat spreader unit by one or more thermal adhesive layers. In an embodiment, the plurality of heat spreader units is provided to couple heat from plurality of pairs of optoelectronic devices with the plurality of heat sinks. This may differ from an approach where bypass diodes are vertically integrated in-line with a heat sink and a cell.

In another aspect of the present invention, an interconnect-integrated diode may be positioned relative to a heat spreader with through-hole via to accommodate the diode. For example, FIG. 5 illustrates a cross-sectional view of an optoelectronic device with a bypass diode, in accordance with an embodiment of the present invention.

Figure 5:
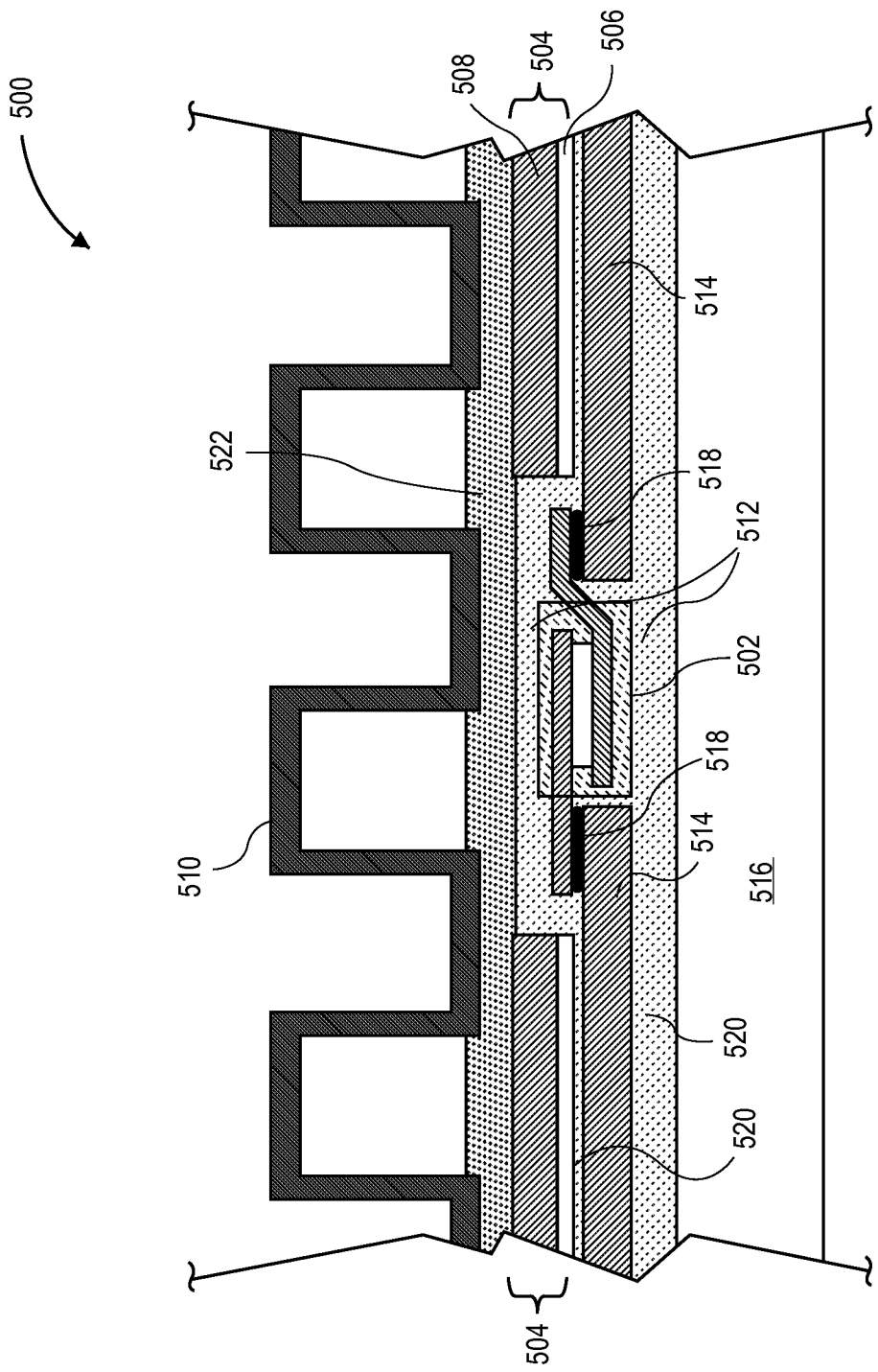
FIG. 5 illustrates a cross-sectional view of an optoelectronic device with a bypass diode, in accordance with an embodiment of the present invention.

Referring to FIG. 5, an optoelectronic device 500 includes a bypass diode 502. Optoelectronic device 500 also includes a heat spreader unit 504 disposed above, but not extending over, bypass diode 502. In accordance with an embodiment of the present invention, heat spreader unit 504 includes one or more dielectric layers 506 and one or more thermally conductive layers 508, as depicted in FIG. 5. Optoelectronic device 500 also includes a heat sink 510 disposed above heat spreader unit 504.

Referring again to FIG. 5, in an embodiment, bypass diode 502 is disposed in a through-hole via 512 disposed in heat spreader unit 504. In an embodiment, bypass diode 502 is coupled with a pair of interconnects 514, heat spreader unit 504 disposed above the pair of interconnects 514, as depicted in FIG. 5. In one embodiment, bypass diode 502 and the pair of interconnects 514 are disposed above a transparent superstrate 516, bypass diode 502 is coupled with the pair of interconnects 514 by one or more bond pads 518, and bypass diode 502 is separated from transparent superstrate 516 and heat spreader unit 504 by one or more encapsulant layers 520. In an embodiment, heat sink 510 includes a folded fin separated from heat spreader unit 504 by one or more thermal adhesive layers 522, as depicted in FIG. 5. In an alternative embodiment, not shown, heat sink 510 includes a plurality of stand-alone fins coupled by a common base, the common base separated from heat spreader unit 504 by one or more thermal adhesive layers. In an embodiment, the S-shaped bend in the bottom lead of diode 502 aids in reduction of coefficient of thermal expansion related stresses that may develop during normal operating temperature ranges. In an additional embodiment, the interconnects 514 are bent with a similar S-shape and a bare diode die is mounted directly between the interconnects, removing the need for additional bond pads between the bare diode die and the diode leads.

In another embodiment, diode 502 is encapsulated prior to assembly to form optoelectronic device 500. In one embodiment, this approach allows for isolation of an elevated temperature of the diode die, which can tolerate significantly higher temperatures as compared with optoelectronic system encapsulant 520. In one embodiment, the material surrounding such an initially encapsulated diode 502 is itself encapsulated by a material different from optoelectronic system encapsulant 520, as depicted by the different shading within the box surrounding diode 502 in FIG. 5.

In association with the discussion of FIGS. 2, 3, and 5 above, a plurality of optoelectronic devices, such as the optoelectronic device of FIG. 5, may be included in an optoelectronic system. Thus, in accordance with an embodiment of the present invention, an optoelectronic system includes a plurality of pairs of optoelectronic devices. In one embodiment, each optoelectronic device is a back-contact solar cell. The optoelectronic system also includes a plurality of bypass diodes, one or more of the bypass diodes disposed between each of the pairs of optoelectronic devices. The optoelectronic system also includes a plurality of heat spreader units, one or more of the heat spreader units disposed above, but not extending over, each of the bypass diodes. The optoelectronic system also includes a plurality of heat sinks, one or more of the heat sinks disposed above each of the heat spreader units.

In an embodiment, each bypass diode of the above optoelectronic system is disposed in a through-hole via disposed in one of the heat spreader units. In an embodiment, each bypass diode is coupled with a pair of interconnects, one of the heat spreader units disposed above the pair of interconnects. In one embodiment, each bypass diode and the respective pair of interconnects are disposed above a transparent superstrate, each bypass diode is coupled with the respective pair of interconnects by one or more bond pads, and each bypass diode is separated from the substrate and the heat spreader unit by one or more encapsulant layers. In an embodiment, each heat sink includes a folded fin separated from the respective heat spreader unit by one or more thermal adhesive layers. In an alternative embodiment, each heat sink includes a plurality of stand-alone fins coupled by a common base, each common base separated from the respective heat spreader unit by one or more thermal adhesive layers. In an embodiment, the plurality of heat spreader units is provided to couple heat from plurality of pairs of optoelectronic devices with the plurality of heat sinks. This may differ from an approach where bypass diodes are vertically integrated in-line with a heat sink and a cell.

Figure 6:
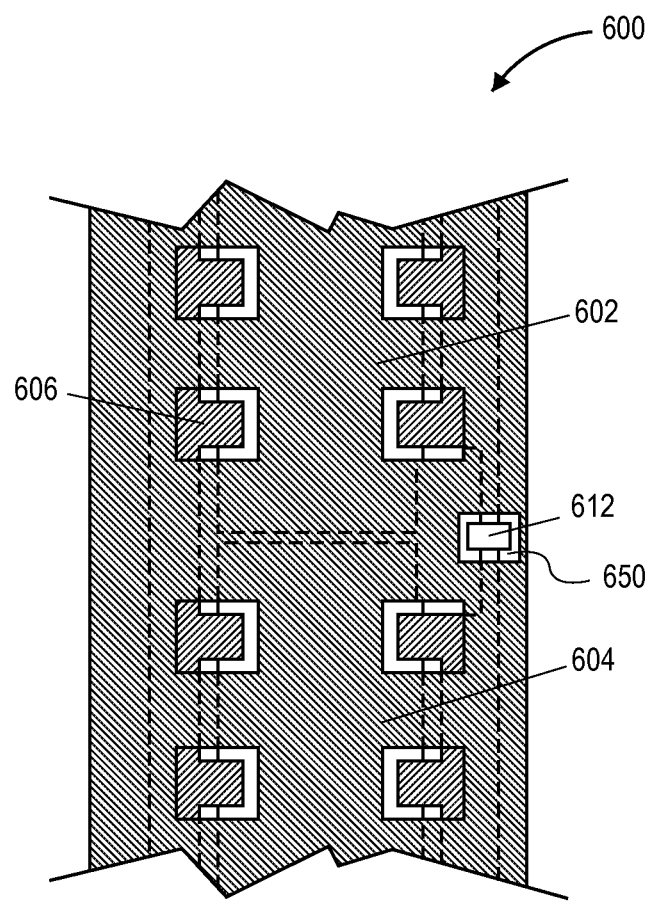
FIG. 6 illustrates a top-down view of an optoelectronic device with a heat spreader unit, in accordance with an embodiment of the present invention.

In an aspect of the present invention, the arrangements of FIGS. 4 and 5 enables the outer surface of the enclosure of optoelectronic devices 400 and 500, respectively, to be flat, providing a uniform surface for bonding a heat sink with an adhesive or other bonding material. FIG. 6 illustrates a top-down view of an optoelectronic device with a heat spreader unit, in accordance with an embodiment of the present invention. Referring to FIG. 6, a system 600 includes two (or more) photovoltaic cells 602 and 604. A cell interconnect 606 is disposed above photovoltaic cells 602 and 604. In a particular embodiment, photovoltaic cells 602 and 604 are serially connected. Also depicted is a bypass diode 612. In accordance with an embodiment of the present invention, at least one cell interconnect of the optoelectronic system includes one or more stress relief features. In one embodiment, partial through vias 650 around bypass diode 612 and cell bond pad (also at 606) accommodate for potential increased thickness of these features and ensure a low thermal resistance flat surface for attaching a heat sink.

In another aspect of the present invention, bypass diodes may be used to avoid shaded-cell losses. For example, FIGS. 7A-7B illustrate a solar concentrator apparatus with a summer solstice illumination pattern and a winter solstice illumination pattern, respectively, in accordance with an embodiment of the present invention.

Referring to FIG. 7A, a solar concentrator apparatus 700 can be subjected to an illumination pattern consistent with the sun being high above the horizon, such as at summer solstice. A solar concentrating element or collector, such as a lens (as shown in FIG. 7A), system of lenses, mirror, or system of mirrors, is positioned above an array of solar cells 702. The solar cells in the array of solar cells 702 are coupled via bypass diodes 704 and cell interconnects 706. The array of solar cells may also include heat exchange fins (shown as 708) and a power output wire (not shown).

In accordance with an embodiment of the present invention, insolation 710A is received by the array of solar cells 702 at a time when the sun is directly above the solar concentrating element, or collector. In one embodiment, the solar concentrating element, or collector provides illumination 712A to the entire array of solar cells 702, as depicted in FIG. 7A.

Figure 7B:
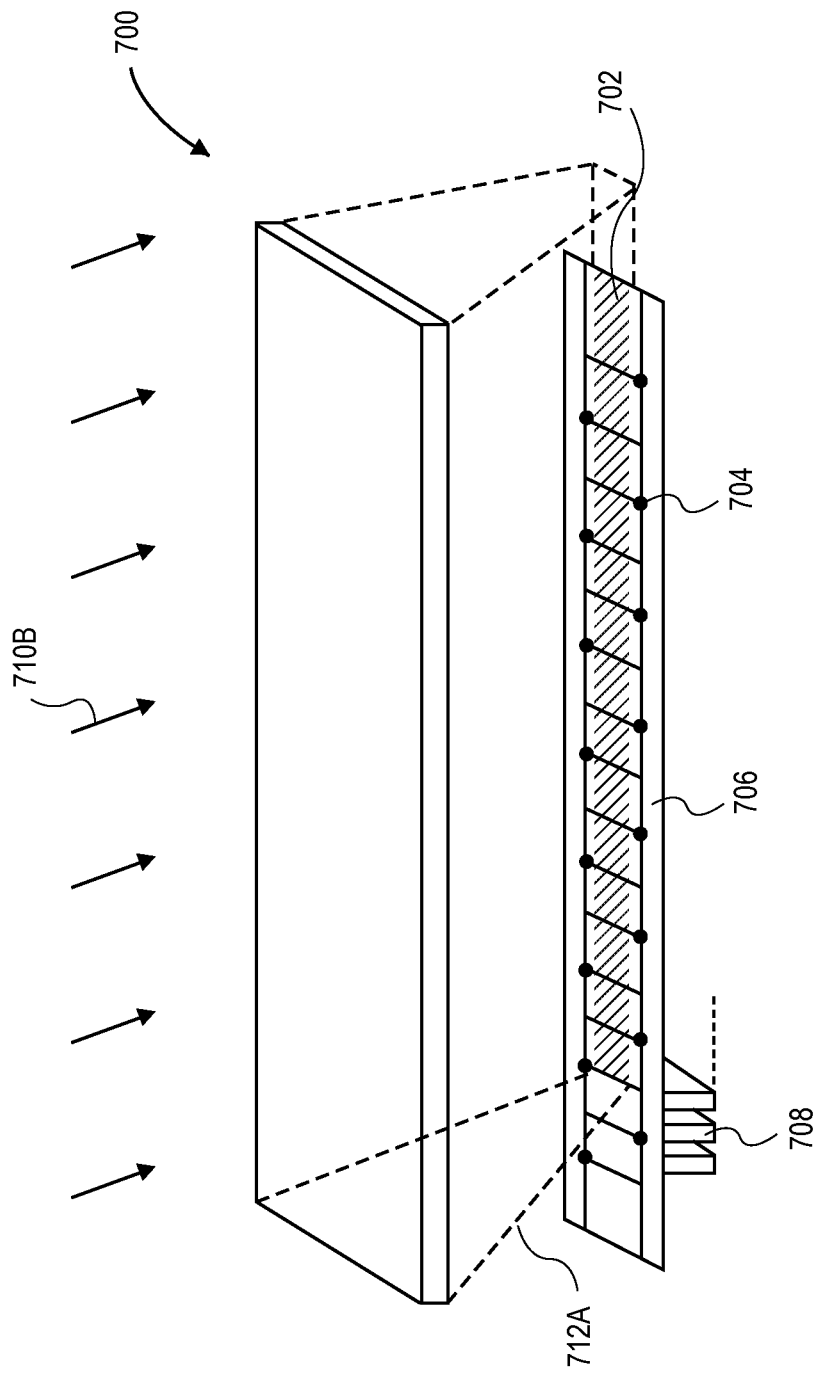
FIG. 7B illustrates a solar concentrator apparatus with a winter solstice illumination pattern, in accordance with an embodiment of the present invention.

Referring to FIG. 7B, the solar concentrator apparatus 700 can also be subjected to an illumination pattern consistent with the sun being low above the horizon, such as at winter solstice. In accordance with an embodiment of the present invention, insolation 710B is received by the array of solar cells 702 at a time when the sun is not directly above the solar concentrating element, or collector. In one embodiment, the solar concentrating element, or collector provides illumination 712B to only a portion of the array of solar cells 702, as depicted in FIG. 7B. In an embodiment, the cells that are not illuminated cannot pass the required current and would otherwise be forced into a power dissipation mode (e.g., reverse bias) to accommodate the current generated by the illuminated cells. The cells may then sink some of the generated power while heating significantly.

Accordingly, in an embodiment, bypass diodes such as the bypass diodes described herein are used to remove groupings of cells at the end or ends of a linear receiver such that little power is lost due to the cells in the array which are not receiving and incident insolation. In one embodiment, the bypass diodes on an array of solar cells are arranged in a way consistent with optimization of cost and performance. For example, in a specific embodiment, an arrangement of solar cells and bypass diodes provides bypassing the final 2, 4, 6, 8 or 10 cells in a linear grouping of cells.

Thus, optoelectronic devices with bypass diodes have been disclosed. In accordance with an embodiment of the present invention, an optoelectronic device includes a bypass diode, a heat spreader unit disposed above, and extending over, the bypass diode, and a heat sink disposed above the heat spreader unit. In one embodiment, the bypass diode is disposed in a recessed cavity under the heat spreader unit. In accordance with another embodiment of the present invention, an optoelectronic device includes a bypass diode, a heat spreader unit disposed above, but not extending over, the bypass diode, and a heat sink disposed above the heat spreader unit. In one embodiment, the bypass diode is disposed in a through-hole via disposed in the heat spreader unit.

What is claimed is:

1. A solar system, comprising:
   at least one bypass diode;
   at least one heat spreader unit having at least a bottom side, the at least one heat spreader unit being disposed above, and extending over, the at least one bypass diode, wherein the at least one bypass diode is disposed in a recessed cavity formed in the bottom side of the at least one heat spreader unit,
   wherein the at least one heat spreader unit comprises at least a first heat spreader layer, and wherein the recessed cavity defines a gap in the first heat spreader layer;
   at least one transparent superstrate, wherein the at least one bypass diode is disposed above the at least one transparent superstrate;
   at least one encapsulant layer separating the at least one bypass diode and the at least one heat spreader unit;
   at least a second encapsulant layer separating the at least one bypass diode and the at least one transparent superstrate; and
   at least one heat sink disposed above the at least one heat spreader unit,
   wherein, in a first cross-sectional side view, the at least one encapsulant layer is at least partially disposed in the recessed cavity formed in the bottom side of the at least one heat spreader unit;
   wherein, in the first cross-sectional side view, the at least one encapsulant layer is also at least partially disposed between the at least one heat spreader unit and the at least one bypass diode;
   wherein, in the first cross-sectional side view, the at least one encapsulant layer is at least partially disposed along the bottom side of the at least one heat spreader unit, and
   wherein, in the first cross-sectional side view, the second encapsulant layer is disposed between the at least one bypass diode and the at least one transparent superstrate.

2. The solar system of claim 1, wherein each of the at least one bypass diodes is coupled with a pair of interconnects, the at least one heat spreader unit disposed above the pair of interconnects.

3. The solar system of claim 2, wherein the pair of interconnects are disposed above the at least one transparent superstrate, and wherein the at least one bypass diode is coupled with the pair of interconnects by one or more bond pads.

4. The solar system of claim 2, wherein the at least one bypass diode is disposed between the pair of interconnects.

5. The solar system of claim 4, further comprising a solar cell, wherein the pair of interconnects is substantially parallel to the solar cell and laterally offset from the solar cell in a direction substantially parallel to the bottom side of the at least one heat spreader unit.

6. The solar system of claim 1, wherein the at least one heat sink comprises a folded fin separated from the at least one heat spreader unit by one or more thermal adhesive layers.

7. The solar system of claim 1, wherein the at least one heat spreader unit comprises a second heat spreader layer, and wherein the second heat spreader layer spans the gap over the at least one bypass diode.

8. The solar system of claim 1, wherein the at least one heat sink is coupled to a substantially flat top side of the at least one heat spreader unit.

9. The solar system of claim 1, wherein a bottom lead of the at least one bypass diode comprises an S-shaped bend.

10. A solar system, comprising:
    a plurality of pairs of solar cells;
    a plurality of bypass diodes, one or more bypass diodes disposed between each of the pairs of solar cells;
    a plurality of heat spreader units, one or more heat spreader units disposed above, and extending over, each of the bypass diodes,
    wherein each heat spreader unit has at least a bottom side,
    wherein each bypass diode is disposed in a recessed cavity formed in the bottom side of one of the heat spreader units,
    wherein each heat spreader unit comprises at least a first heat spreader layer, and wherein the recessed cavity defines a gap in the first heat spreader layer;
    at least one transparent superstrate, wherein the plurality of bypass diodes is disposed above the at least one transparent superstrate;
    at least one encapsulant layer separating the plurality of bypass diodes and the plurality of heat spreader units;

at least a second encapsulant layer separating the plurality of bypass diodes and the at least one transparent superstrate; and a plurality of heat sinks, one or more heat sinks disposed above each of the heat spreader units, wherein, in a first cross-sectional side view, the at least one encapsulant layer is at least partially disposed in the recessed cavity formed in the bottom side of the heat spreader unit;

wherein, in the first cross-sectional side view, the at least one encapsulant layer is also at least partially disposed between the plurality of heat spreader units and the plurality of bypass diodes;

wherein, in the first cross-sectional side view, the at least one encapsulant layer is at least partially disposed along the bottom side of the plurality of heat spreader units, and wherein, in the first cross-sectional side view, the second encapsulant layer is disposed between the plurality of bypass diodes and the at least one transparent superstrate.

11. The solar system of claim 10, wherein a bottom lead of each bypass diode comprises an S-shaped bend.

12. The solar system of claim 10, wherein each heat sink is coupled to a substantially flat top side of the heat spreader unit.

13. The solar system of claim 10, further comprising:

a solar concentrating element disposed above the plurality of pairs of solar cells, the solar concentrating element to concentrate insolation on light-receiving surfaces of the pairs of solar cells, wherein the plurality of bypass diodes is configured to bypass one or more of the pairs of the solar cells when insolation is not received by the one or more of the pairs of the solar cells.

14. The solar system of claim 13, wherein solar concentrating element is an element selected from the group consisting of a mirror, a grouping of mirrors, a lens, a grouping of lenses, and a combination of one or more mirrors with one or more lenses.

15. The solar system of claim 10, wherein each bypass diode is coupled with a pair of interconnects, one of the heat spreader units disposed above the pair of interconnects.

16. The solar system of claim 15, wherein each bypass diode and the respective pair of interconnects are disposed above the at least one transparent superstrate, wherein each bypass diode is coupled with the respective pair of interconnects by one or more bond pads.

17. The solar system of claim 15, wherein each bypass diode is disposed between the respective pair of interconnects.

18. The solar system of claim 17, wherein each pair of interconnects is substantially parallel to the solar cells and laterally offset from the solar cells in a direction substantially parallel to the bottom sides of the heat spreader units.

19. The solar system of claim 10, wherein each heat sink comprises a folded fin separated from the respective heat spreader unit by one or more thermal adhesive layers.

20. The solar system of claim 10, wherein the plurality of heat spreader units is provided to couple heat from plurality of pairs of solar cells with the plurality of heat sinks.

21. The solar system of claim 10, wherein each heat spreader unit comprises a second heat spreader layer, and wherein the second heat spreader layer spans the gap over the bypass diode.

* * * * *